(12) United States Patent
Shih

(10) Patent No.: US 7,666,321 B2
(45) Date of Patent: Feb. 23, 2010

(54) METHOD FOR DECAPSULATING PACKAGE

(75) Inventor: Tung-Yi Shih, Miaoli County (TW)

(73) Assignee: United Microelectronics Corp., Hsinchu (TW)

( * ) Notice: Subject to any disclaimer, the term of this patent is extended or adjusted under 35 U.S.C. 154(b) by 528 days.

(21) Appl. No.: 11/535,073

(22) Filed: Sep. 26, 2006

(65) Prior Publication Data

US 2008/0124928 A1    May 29, 2008

(51) Int. Cl.
*H01L 21/302* (2006.01)

(52) U.S. Cl. ............................. 216/13; 216/14; 216/21; 216/57; 216/67; 216/83; 438/108; 438/704

(58) Field of Classification Search ................... 216/21, 216/57
See application file for complete search history.

(56) References Cited

U.S. PATENT DOCUMENTS

| | | | | |
|---|---|---|---|---|
| 4,474,621 A * | 10/1984 | Saccocio et al. | ................ | 134/1 |
| 5,783,098 A * | 7/1998 | Martin et al. | ................. | 216/56 |
| 6,358,852 B1 * | 3/2002 | Li et al. | ...................... | 438/690 |
| 6,429,028 B1 * | 8/2002 | Young et al. | ................... | 438/4 |
| 6,709,888 B2 * | 3/2004 | Nadeau | ...................... | 438/106 |
| 7,071,012 B2 * | 7/2006 | Tan et al. | ....................... | 438/14 |
| 7,172,977 B1 * | 2/2007 | Zakharian et al. | ........... | 438/745 |
| 2002/0046855 A1 * | 4/2002 | Hatchard et al. | ........... | 174/52.1 |
| 2005/0028361 A1 * | 2/2005 | Yin et al. | ...................... | 29/841 |
| 2005/0140026 A1 * | 6/2005 | Salmon | ...................... | 257/778 |
| 2006/0134901 A1 * | 6/2006 | Chaware et al. | ............. | 438/612 |
| 2006/0201910 A1 * | 9/2006 | Getty et al. | ................... | 216/57 |
| 2007/0020815 A1 * | 1/2007 | Chaware et al. | ............. | 438/126 |

* cited by examiner

*Primary Examiner*—Anita K Alanko
(74) *Attorney, Agent, or Firm*—Winston Hsu

(57) ABSTRACT

A method for decapsulating a package is provided. The method comprises steps of providing a package having a chip therein, wherein the chip has an active surface and a rear surface. Further, the package further comprises a heat sink, a plurality of solder bumps, a substrate, an underfill and a plurality of solder balls. The method further comprises removing the heat sink and removing the substrate together with the solder balls. A dry etching process is performed to remove a portion of the underfill. A wet etching process is performed to remove the rest portion of the underfill. A thermal process solder bump removal process is performed to melt the solder bumps and then a solder bump removal process is performed to remove the melted solder bumps from the active surface of the chip.

11 Claims, 3 Drawing Sheets

METHOD FOR DECAPSULATING PACKAGE

BACKGROUND OF THE INVENTION

1. Field of Invention

The present invention relates to a semiconductor process. More particularly, the present invention relates to a technology to detection of a method for decapsulating a package.

2. Description of Related Art

Integrated circuit (IC) packaging is a way of separating the IC chips on a wafer after the front-end semiconductor fabrication process, connecting the chips to individual lead frames and encapsulating the chips for a better protection. At present, the most common chip packaging technique includes the flip chip interconnect technology. The method includes providing conductive bumps on the input/output (I/O) contacts of a chip and then flipping over the chip so that the bumps can directly contact a substrate. The major advantages of the flip chip bonding technique are small area occupation, high lead count, short interconnect, low inductance and easy-to-control noise level. As a result, the flip chip package is particularly suitable for producing high-speed, high-performance, light and compact device.

In order to perform a failure analysis on the package or to conduct a rework process on the package, it is necessary to decapsulate the package to be a chip without having the solder bumps and the underfill thereon. The most common method for removing the underfill and the solder bumps is to grind or polish away the substrate from the chip and remove the underfill and the solder bumps as well. However, the surface of the chip is easily damaged during the grinding or polishing process. Therefore, the electrical probing during the failure inspection is seriously affected by the grinding or polishing result. Furthermore, by using the grinding or polishing process, the solder bumps are removed together with the underfill. Therefore, when the underfill is the only part needed to be rework, it is hard to remove the underfill but leave the solder bumps on the chip by using the grinding or polishing process.

In order to remove the underfill without removing the solder bumps or to remove the solder bumps without damaging the underfill, the industry develops several ways. However, none of the methods can remove the underfill completely without leaving the underfill residual on the chip or can remove the underfill completely without damaging the solder bumps. Furthermore, none of the methods can remove the solder bumps without damaging the metal pads on the chip or can remove the solder bumps without spending a lot of money.

SUMMARY OF THE INVENTION

Accordingly, at least one objective of the present invention is to provide a method for removing an underfill from a chip. By applying the method according to the present invention, the underfill is completely removed without damaging the solder bumps.

At least another objective of the present invention is to provide a method for removing solder bumps from a chip. By applying the method according to the present invention, the solder bumps are removed without damaging the metal pads on the chip.

The other objective of the present invention is to provide a method for decapsulating a package without damaging a chip packed therein.

To achieve these and other advantages and in accordance with the purpose of the invention, as embodied and broadly described herein, the invention provides a method for removing an underfill from a chip. The method comprises steps of providing a chip having an active surface, wherein a plurality of solder bumps are disposed on the active surface of the chip and an underfill is disposed over the active surface and filling between the solder bumps. A dry etching process is performed in an inert-gas environment to remove a portion of the underfill. A wet etching process is performed to remove the rest portion of the underfill.

According to one embodiment of the present invention, the dry etching process includes a reaction ion etching process.

According to one embodiment of the present invention, the inert-gas environment includes an argon-gas environment.

According to one embodiment of the present invention, the wet etching process is performed with the use of a fuming nitric acid.

According to one embodiment of the present invention, the wet etching process is performed at a temperature of about 60~100° C. for about 30 seconds~5 minutes.

According to one embodiment of the present invention, the method further comprises a step of performing a purging process to clean the chip by using nitrogen gas.

The invention also provides a method for removing solder bumps from a chip. The method comprises steps of providing a chip having an active surface, wherein a plurality of solder bumps is disposed on the active surface. A thermal process is performed to melt the solder bumps and then a solder bump removal is performed to remove the melted solder bumps from the active surface of the chip.

According to one embodiment of the present invention, the solder bump removal process includes a physical stripping-away process.

According to one embodiment of the present invention, the physical stripping-away process is selected from a group consisting of a disturbing method, a gravity method, suction method, ultrasonic method and a combination thereof.

According to one embodiment of the present invention, when the thermal process is performed at a pressure of about 1 atm, the thermal process is performed at a temperature of about 100~320° C.

According to one embodiment of the present invention, the thermal process is performed in a thermal liquid type system.

According to one embodiment of the present invention, the thermal liquid type system employs a vacuum oil.

The invention further provides a method for decapsulating a package. The method comprises steps of providing a package having a chip therein, wherein the chip has an active surface and a rear surface. Further, the package further comprises a heat sink, a plurality of solder bumps, a substrate, an underfill and a plurality of solder balls. The heat sink is disposed over the rear surface of the chip. The solder bumps are disposed on the active surface of the chip. The substrate has a first surface connected with the chip through the solder bumps. The underfill is disposed between the chip and the substrate and filling between the solder bumps. The solder balls are disposed on a second surface of the substrate. The method further comprises removing the heat sink and removing the substrate together with the solder balls. A dry etching process is performed to remove a portion of the underfill. A wet etching process is performed to remove the rest portion of the underfill. A thermal process is performed to melt the solder bumps and then a solder bump removal process is performed to remove the melted solder bumps from the active surface of the chip.

According to one embodiment of the present invention, the dry etching process includes a reaction ion etching process.

According to one embodiment of the present invention, the reaction ion etching process is performed in an inert-gas environment.

According to one embodiment of the present invention, the wet etching process is performed with the use of a fuming nitric acid.

According to one embodiment of the present invention, the wet etching process is performed at a temperature of about 60~100° C. for about 30 seconds~5 minutes.

According to one embodiment of the present invention, the method further comprises a step of performing a purging process to clean the chip by using nitrogen gas before the solder bump removal process is performed.

According to one embodiment of the present invention, the solder bump removal process includes a physical stripping-away process.

According to one embodiment of the present invention, the physical stripping-away process is selected from a group consisting of a disturbing method, a gravity method, suction method, ultrasonic method and a combination thereof.

According to one embodiment of the present invention, when the thermal process is performed at a pressure of about 1 atm, the thermal process is performed at a temperature of about 100~320° C.

According to one embodiment of the present invention, the thermal process is performed in a thermal liquid type system.

According to one embodiment of the present invention, the thermal liquid type system employs vacuum oil.

In the present invention, by applying the method for removing the underfill and the method for removing the solder bumps according to the present invention in the method for decapsulating the package, the underfill can be completely removed without damaging the solder bumps or leaving the underfill residual on the chip and the solder bumps can be removed without damaging the metal pads on the chips. Hence, the performance of the reverse engineering, the rework process or the failure inspection process is not affected by the processes for removing the underfill and the solder bumps. Furthermore, since the solder bumps are removed by utilizing the physical property of the material of the solder bumps, the cost for removing the solder bumps is low.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
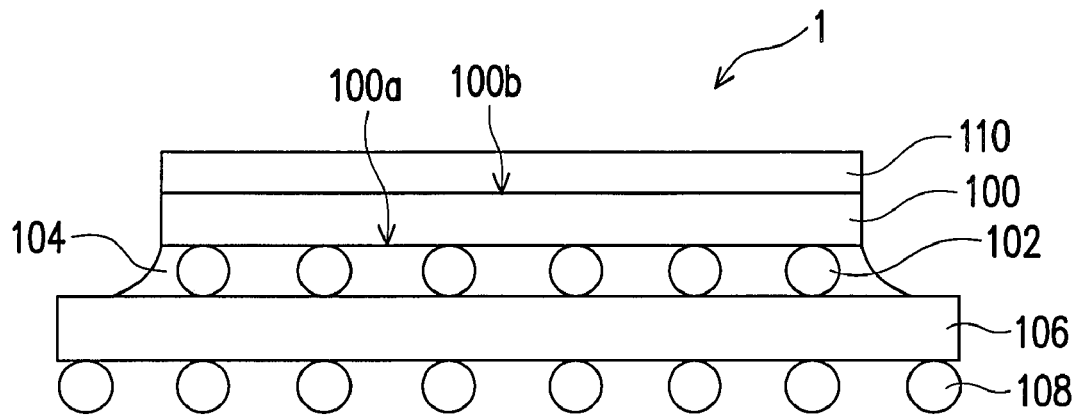
FIG. 1 is a cross-sectional view schematically illustrating a package.
Figure 2:
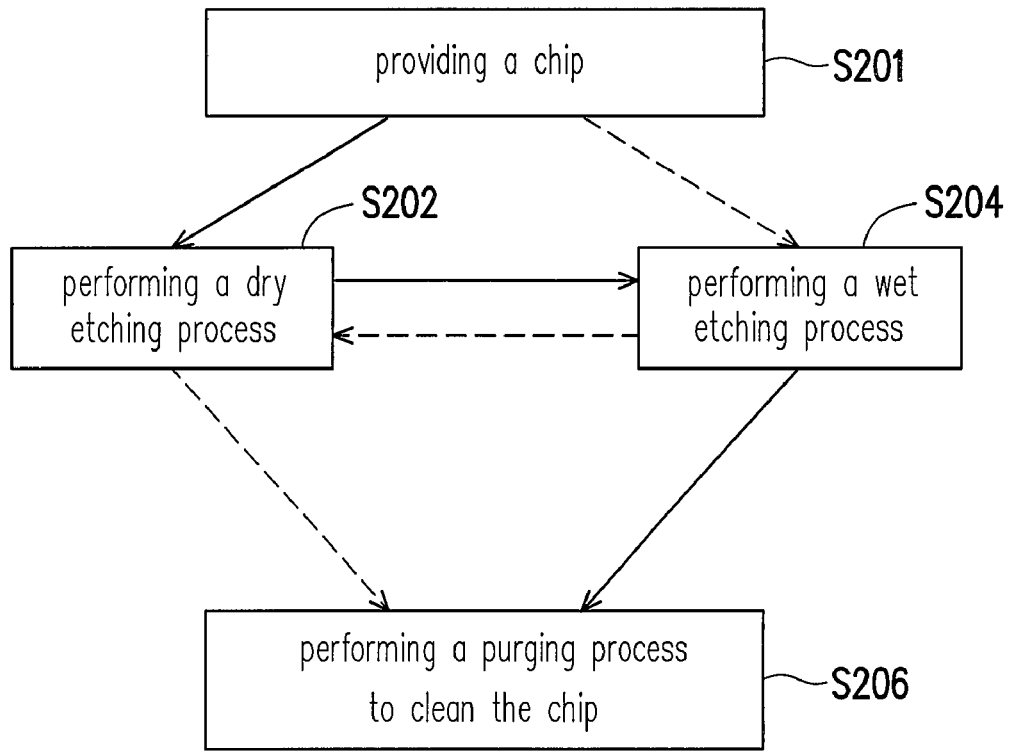
FIG. 2 is a process flow showing a method for removing an underfill from a chip according to one embodiment of the present invention.

FIG. 1 is a cross-sectional view schematically illustrating a package. FIG. 2 is a process flow showing a method for removing an underfill from a chip according to one embodiment of the present invention. As shown in FIG. 1, a package 1 is provided. The package 1 can be, for example, a flip-chip package. Furthermore, the package 1 comprises a chip 100 and a substrate 106. The chip 100 further comprises an active surface 100a and a rear surface 100b. The chip 100 is disposed over the substrate 106 in a way that the active surface 100a is opposite to the substrate 106. There are several solder bumps 102 are disposed on the active surface of the chip 100 and between the chip 100 and the substrate 106. That is, the substrate 106 is connected to the chip 100 through the solder bumps 102. Also, an underfill 104 is further disposed between the substrate 106 and the chip 100 and filling between the solder bumps 102. Moreover, on the rear surface 100b of the chip 100, there is a heat sink 110. In addition, there are several solder balls 108 are disposed on a surface of the substrate 106 other than the surface in contact with the solder bumps 102.

As shown in FIG. 2, before the method for removing the underfill, the heat sink 110 and the substrate 106 with the solder balls 108 are removed to expose the rear surface 100b of the chip 100, the underfill 104 and the solder bumps 102 (step S201). Then, by following the solid arrows, in the step S202, a dry etching process is performed to remove a portion of the underfill 104 (as shown in FIG. 1). Thereafter, in the step S204, a wet etching process is performed to remove the rest portion of the underfill 104 to expose a portion of the active surface 100a of the chip 100 and the solder bumps 102. Alternatively, by following the dotted arrows, the underfill 104 can be removed by performing the wet etching process prior to the dry etching process. Then, in the step S206 (following either the indication of the solid arrow or the indication of the dotted arrow), a purging process is performed to clean the chip 100. Hence, the solder bumps 102 are fully exposed and a portion of the active surface 100a of the chip 100 is exposed as well. Therefore, the failure inspection can be performed on the solder bumps 100a.

It should be noticed that the dry etching process can be, for example, a reaction ion etching process. Also, the dry etching process can be, for example, performed in an inert-gas environment, such as an argon-gas environment. Furthermore, the wet etching process can be, for example, performed with the use of a fuming nitric acid at a temperature of about 60~100° C. for about 30 seconds~5 minutes. In addition, the purging process can be, for example, performed by spraying the nitrogen gas through a nozzle onto the chip.

In the conventional underfill removal process, the underfill is removed by only using the wet etching method so that it takes a lot of the time for removing the underfill from the chip. Therefore, the time for the solder bumps exposing under the corrosive solution of the wet etching process is long. Hence, the solder bumps are damaged at the time the underfill is removed. As for another conventional method for removing the underfill, the underfill is removed by dry etching only so that a portion of the underfill still remains on the chip. Therefore, inspection accuracy of the failure analysis is affected. By comparing to the conventional underfill removal process, in the present invention, the wet etching process and the dry etching process are performed to remove the underfill. Therefore, the time for performing the wet etching process is short so that the solder bumps can be prevent from being damaged by the etchant. In addition, because of the assistance of the wet etching, the underfill residual left by the dry etching process can be completely removed.

Figure 3:
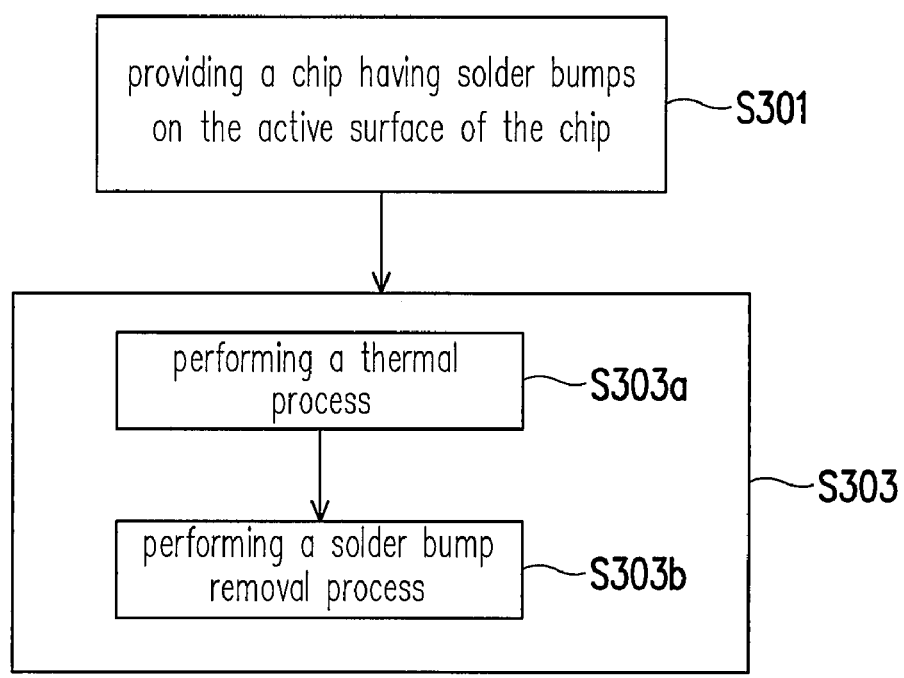
FIG. 3 is a process flow showing a method for removing solder bumps from a chip according to one embodiment of the present invention.

When the package failure happens on the chip, it is necessary to remove the solder bumps from the chip for further examination. FIG. 3 is a process flow showing a method for removing solder bumps from a chip according to one embodiment of the present invention. As shown in FIG. 3, the chip 100 with the solder bumps 102 is provided (step S301). It should be noticed that, the underfill 104 can be either remaining on the active surface 100a of the chip 100 or removed beforehand. Then, in the step S303, a removal process including a thermal process S303a and a solder bump removal process S303b is performed to melt the solder bumps 102 and then to remove the melted solder bumps from the active surface 100a of the chip 100.

Notably, the solder bump removal process S303b includes a physical stripping-away process. Also, the physical stripping-away process can be selected from a group consisting of a disturbing method, a gravity method, suction method, ultrasonic method and a combination thereof. Moreover, when the thermal process S303a is performed at a pressure of about 1 atm, the thermal process S303a is performed at a temperature of about 100~320° C. Furthermore, the thermal process is performed in a thermal liquid type system with the use of vacuum oil. That is, during the solder bump removal process, the thermal liquid, such as vacuum oil, is used as a heating medium and the solder bumps 102 melt in the thermal liquid and then the melted solder bumps are removed by using a physical tripping-away process mentioned above. Hence, the metal pads on the chip are exposed.

Taking the commercialized solder bump materials as examples, Table 1 shows the compositions and the melting points of three common solder bump materials. According to the material of the solder bumps, the process temperature of the solder bump removal process is varied.

TABLE 1

| Material | Composition | Melting points |
| --- | --- | --- |
| Eutectic | Sn/Pb = 63/37 | 183° C. |
| High lead | Sn/Pb = 3/97, 10/90, 5/95 | 310~320° C. |
| Leed free | Major: Sn—Ag and Sn—Ag—Cu | 221° C.(Sn/Ag) |
| | | 217° C.(Sn/Ag/Cu) |

In addition, in the conventional method for removing the solder bumps from the chip with the use of a nitric acid-based solution, the solder bumps are eroded by the solution and the metal pads on the chip are damaged by the solution as well. Furthermore, it is clearly shown in the experimental data that the removal performance of the nitric acid-based solution is poor for removing the solder bumps made of high-lead material. On the contrary, in the method of the present invention, the solder bumps are removed from the chip by using a method according to the physical property of the material of the solder bumps. Hence, the metal pads on the chip are not damaged and the cost for performing the solder bump removal process is low.

Figure 4:
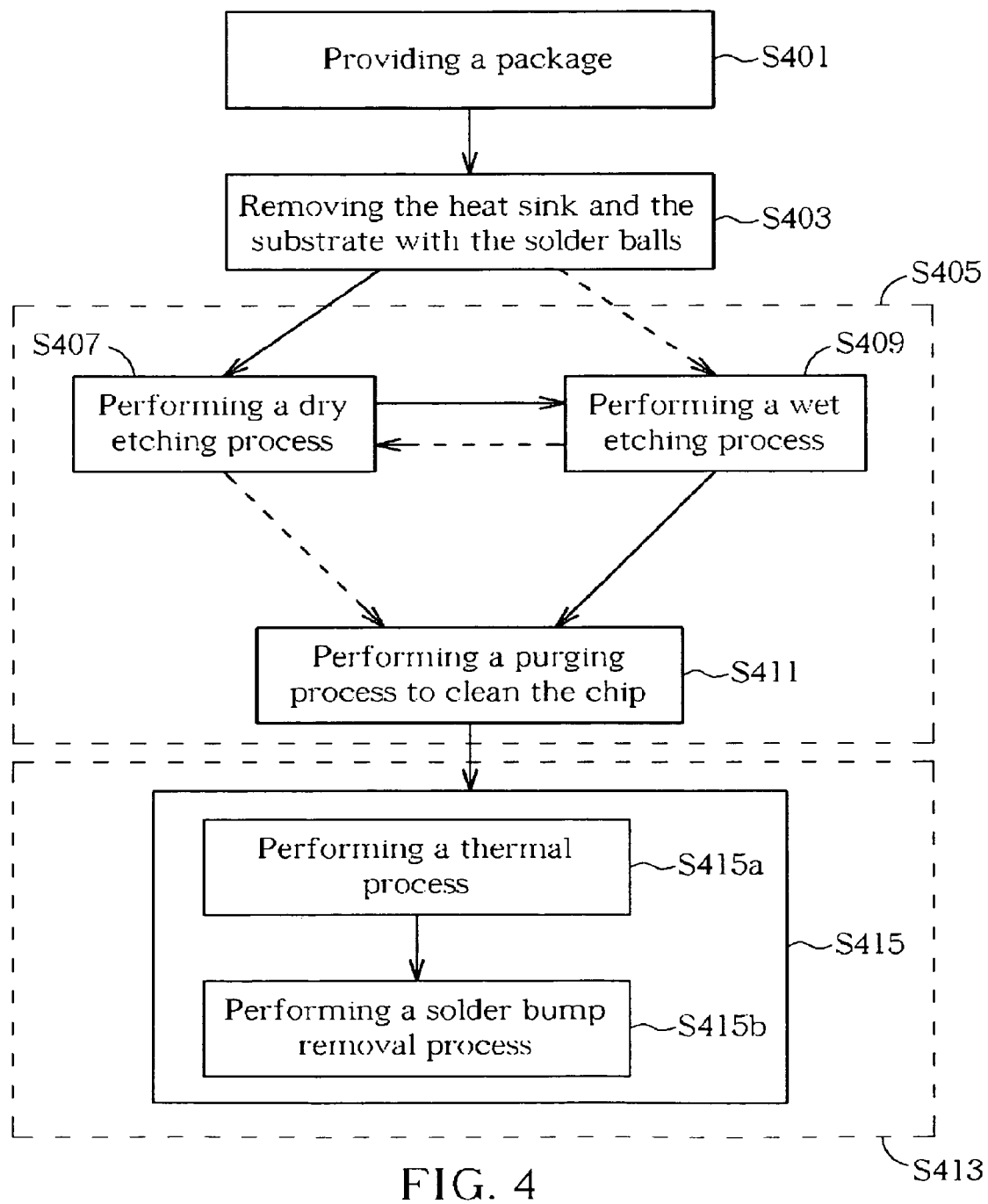
FIG. 4 is a process flow showing a method for decapsulating a package according to one embodiment of the present invention.

FIG. 4 is a process flow showing a method for decapsulating a package according to one embodiment of the present invention. When a reverse engineering, a rework process or a failure inspection process is performed on the chip, the decapsulation of the package is performed. The method for decapsulating the package is the combination of the aforementioned method for removing the underfill (shown in FIG. 2) and the method for removing the solder bumps (shown in FIG. 3). As shown in FIG. 4, in the step S401, a package 1 (shown in FIG. 1) is provided. Then, in the step S403, the heat sink 110 is removed and the substrate 106 with the solder balls 108 is removed as well. Thereafter, in the step S405, the underfill 104 is removed. As mentioned above, in the method for removing the underfill 104, either the dry etching process (S407) or the wet etching process (S409) can be performed first. That is, by following the solid arrows, the dry etching process (S409) is performed prior to the wet etching process (S409). Alternatively, by following the dotted arrows, the wet etching process (S409) is performed prior to the dry etching process (S407). After the underfill 104 is removed, a purging process is performed by spraying the nitrogen gas onto the chip through a nozzle to clean the surface of the chip 100 (S411). Then, the method for removing the solder bumps 102 is performed (S413). As described above, in the step S415, a removal process including a thermal process S415a and a solder bump removal process S415b is performed to melt the solder bumps 102 and then to remove the melted solder bumps from the active surface 100a of the chip 100. The recipes for the method for removing the underfill and the method for removing the solder bumps are as same as what have mentioned above and are not described herein.

By applying the method for removing the underfill and the method for removing the solder bumps according to the present invention in the method for decapsulating the package, the underfill can be completely removed without damaging the solder bumps or leaving the underfill residual on the chip and the solder bumps can be removed without damaging the metal pads on the chips. Hence, the performance of the reverse engineering, the rework process or the failure inspection process is not affected by the processes for removing the underfill and the solder bumps. Furthermore, since the solder bumps are removed by utilizing the physical property of the material of the solder bumps, the cost for removing the solder bumps is low.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for decapsulating a package, comprising:
providing a package having a chip therein, wherein the chip has an active surface and a rear surface and the package further comprises:
a heat sink disposed over the rear surface of the chip;
a plurality of solder bumps disposed on the active surface of the chip;
a substrate, wherein a first surface of the substrate is connected with the chip through the solder bumps;
an underfill disposed between the chip and the substrate and filling between the solder bumps;
a plurality of solder balls disposed on a second surface of the substrate;
removing the heat sink;
removing the substrate together with the solder balls;
performing a dry etching process to remove a portion of the underfill;
performing a wet etching process to remove the rest portion of the underfill;
performing a thermal process to melt the solder bumps; and
performing a solder bump removal process to remove the melted solder bumps from the active surface of the chip.

2. The method of claim 1, wherein the dry etching process includes a reaction ion etching process.

3. The method of claim 2, wherein the reaction ion etching process is performed in an inert-gas environment.

4. The method of claim 1, wherein the wet etching process is performed with the use of a fuming nitric acid.

5. The method of claim 1, wherein the wet etching process is performed at a temperature of about 60-100° C. for about 30 seconds~5 minutes.

6. The method of claim 1 further comprising performing a purging process to clean the chip by using nitrogen gas before the solder bump removal process is performed.

7. The method of claim 1, wherein the solder bump removal process includes a physical stripping-away process.

8. The method of claim 7, wherein the physical stripping-away process is selected from a group consisting of a disturbing method, a gravity method, suction method, ultrasonic method and a combination thereof.

9. The method of claim 1, wherein when, at a pressure of about 1 atm, the thermal process is performed at a temperature of about 100~320° C.

10. The method of claim 1, wherein the thermal process is performed in a thermal liquid type system.

11. The method of claim 10, wherein the thermal liquid type system employs a vacuum oil.

* * * * *